(12) United States Patent
James et al.

(10) Patent No.: US 9,713,290 B2
(45) Date of Patent: Jul. 18, 2017

(54) DATACENTER IMMERSED IN COOLING LIQUID

(71) Applicant: MICROSOFT TECHNOLOGY LICENSING, LLC, Redmond, WA (US)

(72) Inventors: Sean James, Olympia, WA (US); Todd Robert Rawlings, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 26 days.

(21) Appl. No.: 14/320,019

(22) Filed: Jun. 30, 2014

(65) Prior Publication Data

US 2015/0382515 A1   Dec. 31, 2015

(51) Int. Cl.
*H01L 23/473* (2006.01)
*H05K 7/20* (2006.01)
*H01L 23/427* (2006.01)

(52) U.S. Cl.
CPC ....... *H05K 7/20818* (2013.01); *H01L 23/427* (2013.01); *H01L 23/473* (2013.01); *H05K 7/203* (2013.01); *H05K 7/2079* (2013.01); *H05K 7/20327* (2013.01); *H05K 7/20345* (2013.01); *H05K 7/20809* (2013.01)

(58) Field of Classification Search
CPC ......... H01L 2924/0002; H01L 2924/00; H01L 2924/00014; H01L 23/473; H01L 23/427; H01L 23/467; H05K 7/20772; H05K 7/20809; H05K 7/20836; H05K 7/20781; H05K 7/2079; H05K 7/203; H05K 7/20236; H05K 7/20818; H05K 7/20281; H05K 7/20736; H05K 7/20218; H05K 7/20709; H05K 7/1497; H05K 7/20; H05K 7/20336; H05K 7/20381; H05K 7/20345; H05K 7/20718; H05K 5/067; H05K 7/20645; G06F 1/20; G06F 2200/201

See application file for complete search history.

(56) References Cited

U.S. PATENT DOCUMENTS 1,757,174 A   6/1930   Douglas
2,870,729 A   1/1959   Shannon et al.
(Continued)

FOREIGN PATENT DOCUMENTS

CN   201846435 U   5/2011
DE   102011115657 A1   3/2013
(Continued)

OTHER PUBLICATIONS

"International Search Report & Written Opinion Received for PCT Application No. PCT/US2015/037848", Mailed Date: Oct. 6, 2015, 10 Pages.

(Continued)

*Primary Examiner* — Adam B Dravininkas (57) ABSTRACT

The subject disclosure is directed towards a datacenter or partial datacenter (e.g., a datacenter module) contained in a sealed container. The container may be filled with a cooling fluid, such as a dielectric fluid, to help cool the datacenter components. The container and its internal datacenter or datacenter portion may be submerged in water, in which event the fluid also helps to equalize the external water pressure.

11 Claims, 8 Drawing Sheets

(56) References Cited

U.S. PATENT DOCUMENTS

| | | | |
|---|---|---|---|
| 4,411,213 | A | 10/1983 | Laukien |
| 5,511,504 | A | 4/1996 | Martin |
| 6,186,702 | B1 | 2/2001 | Bartkowski |
| 7,525,207 | B2 | 4/2009 | Clidaras et al. |
| 8,549,869 | B1 | 10/2013 | Whitted et al. |
| 8,636,565 | B2 | 1/2014 | Carlson et al. |
| 8,853,872 | B2 | 10/2014 | Clidaras et al. |
| 8,854,809 | B2 | 10/2014 | Neumann et al. |
| 8,913,383 | B1 * | 12/2014 | Goldsmith ......... H05K 7/20236 257/714 |
| 2008/0055850 | A1 * | 3/2008 | Carlson ................ G06F 1/20 361/695 |
| 2008/0209234 | A1 * | 8/2008 | Clidaras ............. F03B 13/1885 713/300 |
| 2009/0078401 | A1 | 3/2009 | Cichanowicz |
| 2009/0229194 | A1 | 9/2009 | Armillas |
| 2009/0295167 | A1 * | 12/2009 | Clidaras ................ F03B 13/20 290/55 |
| 2009/0297270 | A1 | 12/2009 | Black et al. |
| 2011/0132579 | A1 * | 6/2011 | Best ................... H05K 7/20763 165/104.31 |
| 2011/0154842 | A1 * | 6/2011 | Heydari ............ H05K 7/20836 62/259.2 |
| 2011/0240497 | A1 | 10/2011 | Dechene et al. |
| 2011/0247348 | A1 * | 10/2011 | Mashiko ............. H05K 7/2079 62/62 |
| 2012/0232879 | A1 | 9/2012 | Iyengar et al. |
| 2013/0044426 | A1 * | 2/2013 | Neumann ................ G06F 1/20 361/679.54 |
| 2013/0058029 | A1 | 3/2013 | Ootani et al. |
| 2013/0125825 | A1 | 5/2013 | Kania et al. |
| 2013/0190941 | A1 | 7/2013 | Cader et al. |
| 2015/0194813 | A1 * | 7/2015 | Finn ..................... H05K 7/1497 307/19 |
| 2015/0321739 | A1 * | 11/2015 | Dehlsen .................. B63G 8/18 165/45 |

FOREIGN PATENT DOCUMENTS

| | | |
|---|---|---|
| WO | 2009108070 A1 | 9/2009 |
| WO | 2012129612 A1 | 10/2012 |
| WO | 2013184820 A1 | 12/2013 |
| WO | 2014120275 A1 | 8/2014 |

OTHER PUBLICATIONS

Patel, et al., "Thermal Considerations in Cooling Large Scale High Compute Density Data Centers", In the Eighth Intersociety Conference on Thermal and Thermomechanical Phenomena in Electronic Systems, May 2002, 10 pages.

U.S. Appl. No. 13/917,636, Rubenstein, et al., "Renewable Energy Based Datacenter Cooling", filed Jun. 13, 2013, 31 pages.

Miller, Rich, "Google Planning Offshore Data Barges", Published on: Sep. 6, 2008, 5 pages Available at: http://www.datacenterknowledge.com/archives/2008/09/06/google-planning-offshore-data-barges/.

Miller, Rich, "Data Centers on Cargo Ships?", Published on: Jan. 8, 2008, 5 pages Available at: http://www.datacenterknowledge.com/archives/2008/01/08/data-centers-on-cargo-ships/.

"International Search Report & Written Opinion Received for PCT Application No. PCT/US2015/037847", Mailed Date: Nov. 9, 2015, 11 pages.

Trabish, Herman K., "Ocean Energy to Power Google's Sea-Going Data Center", Published on: Sep. 10, 2008, 4 pages Available at: http://newenergynews.blogspot.in/2008/09/ocean-energy-to-power-googles-sea-going.html.

Offce Action Summary, U.S. Appl. No. 14/272,656, Notification Date: Nov. 30, 2015, 12 pages.

Green (Low Carbon) Data Center Blog, The Under Water Data Center, Response to Risks of Google's Floating Data Center, Submerge, Sep. 12, 2008, 3 pages. Available at: http://www.greenm3.com/gdcblog/2008/9/12/the-under-water-data-center-response-to-risks-googlersquo.html.

U.S. Appl. No. 14/272,656, Dehlsen, "Marine Subsurface Data Center Vessel", filed May 8, 2014, 16 pages.

"International Preliminary Report on Patentability Issued in PCT Application No. PCT/US2015/037848", Mailed Date: Apr. 21, 2016, 6 Pages.

Matteson, et al., "Maximizing Data Center Energy Efficiency by Utilizing New Thermal Management and Acoustic Control Methodology", In International Technical Conference and Exhibition on Packaging and Integration of Electronic and Photonic Microsystems, vol. 2, Jul. 16, 2013, 1 page.

Masaki, et al., "Underwater Surveillance System to Counteract Associated Underwater Threats", In NEC Technical Journal, vol. 8, Issue 1, Sep. 2013, pp. 63-67.

Felemban, Emad, "Advanced Border Intrusion Detection and Surveillance Using Wireless Sensor Network Technology", In International Journal of Communications, Network and System Sciences, vol. 6, Issue 5, May 2013, pp. 251-259.

Laumer, John, "Google Floats a Data Center Patent: Offshore, Ocean-Cooled, Wave-Powered, and Modular", Published on: Sep. 20, 2008, 4 pages. Available at: http://www.treehugger.com/corporate-responsibility/google-floats-a-data-center-patent-offshore-ocean-cooled-wave-powered-and-modular.html.

Fletcher, Joanna, "What Happened to Google's Floating Data Center?", Published on: Dec. 4, 2010, 2 pages. Available at: http://www.hostway.com/web-resources/find-web-hosting/what-happened-to-googles-floating-data-center/.

* cited by examiner

DATACENTER IMMERSED IN COOLING LIQUID

BACKGROUND

As cloud-based computing and cloud-based services grow, datacenters need to be provided to serve client customers. Customers want fast speeds (lowest possible latency) for their cloud applications. In order to satisfy customers, future data centers need to be positioned as close as possible to the customer base. At the same time, consideration needs to be given to privacy, security, environmental conditions, real estate availability, access to power, cost of power and so on.

SUMMARY

This Summary is provided to introduce a selection of representative concepts in a simplified form that are further described below in the Detailed Description. This Summary is not intended to identify key features or essential features of the claimed subject matter, nor is it intended to be used in any way that would limit the scope of the claimed subject matter.

Briefly, one or more of various aspects of the subject matter described herein are directed towards a datacenter or partial datacenter (e.g., a datacenter module) immersed in a cooling fluid, which may be a dielectric fluid. A container surrounds and seals the cooling fluid and datacenter or partial datacenter, and a heat transfer subsystem cools the cooling fluid and the datacenter or partial datacenter.

The container may be submerged in water to provide an underwater datacenter. If so, the internal fluid also acts to equalize or substantially equalize the water pressure.

Other advantages may become apparent from the following detailed description when taken in conjunction with the drawings.

BRIEF DESCRIPTION OF THE DRAWINGS

The present invention is illustrated by way of example and not limited in the accompanying figures in which like reference numerals indicate similar elements and in which.

DETAILED DESCRIPTION

Various aspects of the technology described herein are generally directed towards cooling a datacenter (generally a facility comprising centrally managed computing resources and related support systems) or a partial datacenter (such as a modular component that with other modules provides a datacenter), with a dielectric fluid. In one or more aspects, the datacenter may be filled with the fluid, which may be circulated for cooling purposes. In alternative aspects, the fluid may be applied to (e.g., sprayed or dripped on) the components which then boils the fluid into a vapor that gets cooled back into a fluid.

Further, the datacenter may be designed to be submerged, for example on the ocean floor or the floor of any similar body of water, such as a lake, river, flooded former quarry and so on. In this way, the datacenter may be deployed relatively close to current and potential customers, and positioned in a way to take advantage of sustainable power that is also environmentally friendly, and take advantage of the massive heat sink provided by the water.

If the datacenter is filled with the fluid, the fluid will act to equalize the water pressure, allowing the datacenter to be submerged in very deep water without needing a particularly strong (thick metal) hull. As a result, the hull may be constructed of any material that is resistant to corrosion and may have other desirable properties, e.g., acts as a good heat conductor, such as certain polymers that would be crushed at deeper pressures if not (substantially) equalized. By positioning the datacenter in deep water, such as anchoring it or sinking it to the ocean floor, the risks of umbilical detachment or damage to the datacenter by external forces are significantly reduced.

It should be understood that any of the examples herein are non-limiting. For example, in one aspect submerged datacenters are exemplified, as is the concept of positioning datacenters on or near the water floor, e.g., by sinking them. Any body of water including an ocean, riverbed, sea, lake, deep pond, and so on may be used. However, submersion of a datacenter, or any part thereof (e.g., a module), is only one way to use the technology described herein. As such, the present invention is not limited to any particular embodiments, aspects, concepts, structures, functionalities or examples described herein. Rather, any of the embodiments, aspects, concepts, structures, functionalities or examples described herein are non-limiting, and the present invention may be used in various ways that provide benefits and advantages in datacenters and computing in general.

Figure 1:
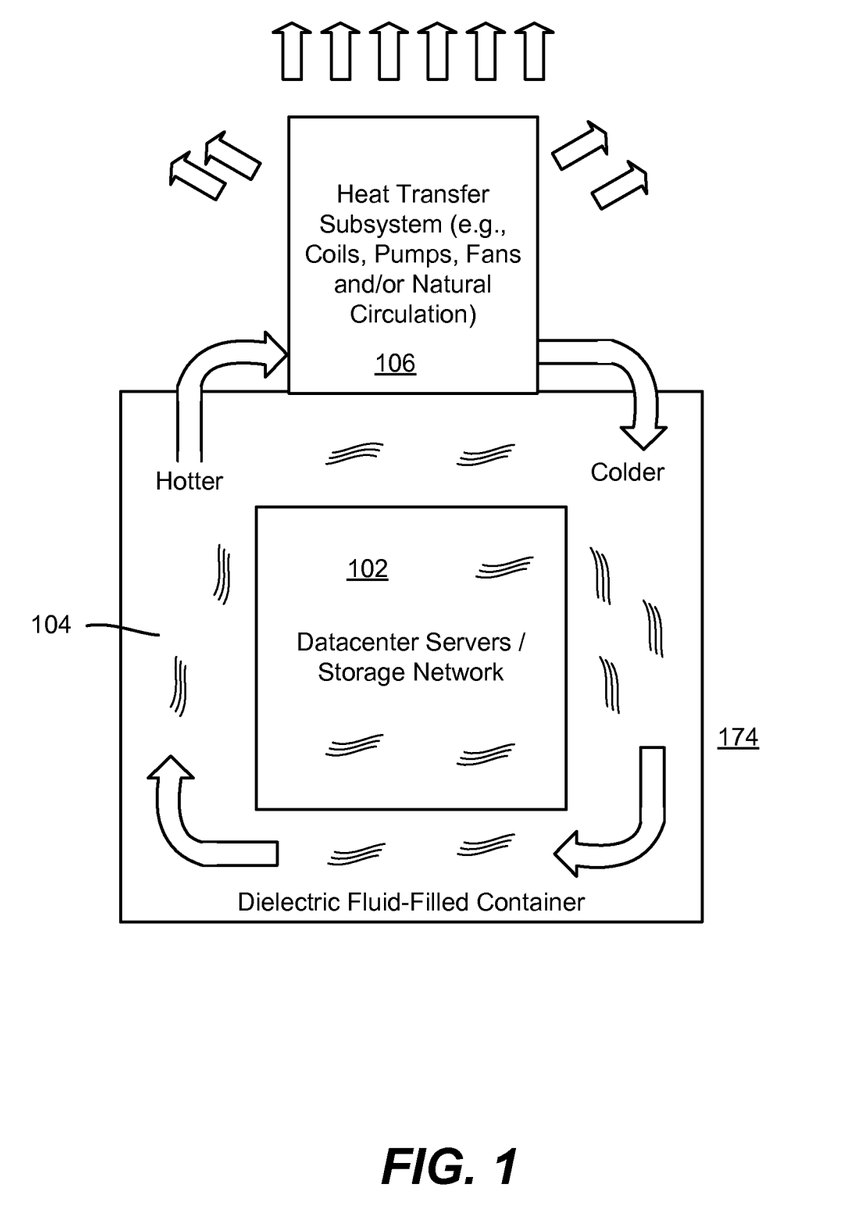
FIG. 1 is an example representation of a center or partial datacenter (e.g., a datacenter module) in which a dielectric fluid is used to help cool the datacenter components, according to one or more example implementations.

As generally represented in the example implementation of FIG. 1, a datacenter 102 (or partial datacenter, such as a module that may be coupled to other modules to increase a datacenter's capacity), is placed in a container 104 filled with a dielectric fluid. The fluid may be circulated by any suitable heat transfer subsystem 106, e.g., using pumps that in a closed loop system pump the fluid through coils or the like, by natural circulation (e.g., heat pipe technology) resulting from heat rising/fluid vaporizing at a desired temperature and pressure (or where a fan can move and cool the vapor), and so on.

The container 104 and (any external part of) the heat transfer subsystem 106 is sealed so that the fluid cannot escape. It should be noted that the container surface 104 also may transfer heat away from the datacenter, and if internal circulation is sufficient, an external heat transfer subsystem may not be needed. Notwithstanding, in one or more implementations, the container is designed to be submerged, and it may be desirable to externally locate any pumps, fans and so on that include moving parts to facilitate replacement or repair if needed.

Various deployments and other aspects of submerged containers are described in copending patent application entitled "Submerged Datacenter" (U.S. Application No. 14/320,019), including ways to obtain power from the water for powering the datacenter, at least in part. For example, waves, tides, and currents may be used to generate power from the water; power also may be provided via waterfalls and wind turbines, including for submerged datacenters. Further, as can be readily appreciated, the heat transferred from the datacenter may be used to generate some power.

Figure 2:
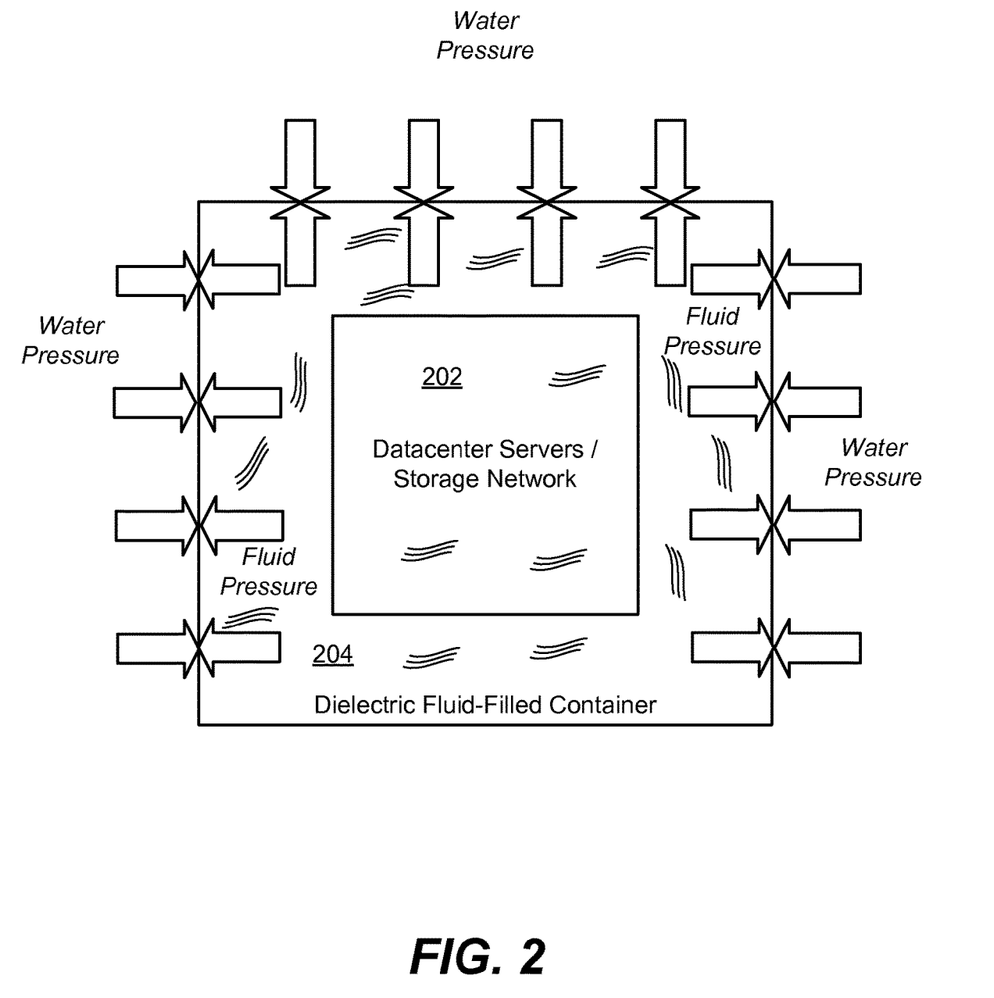
FIG. 2 is an example representation of submerged datacenter or partial datacenter, in which fluid therein acts to equalize the external water pressure, according to one or more example implementations.

FIG. 2 shows the concept of how the cooling fluid also helps with pressure equalization of a container 204. Because fluids cannot be (significantly) compressed, the container 204 need not be designed for the significant amount of water pressure that occurs at deeper depths (although the design of the components of the datacenter or partial datacenter 202 will need to take the container's internal pressure into consideration). This allows for container materials that are easy to seal for submarine conditions, which may be highly corrosive in saltwater deployments. For example, polymers may be used for the container, or as a coating on a relatively thin metal container, rather than needing thick metal for its strength.

The dielectric fluid enables a high-density server, storage and network equipment design by providing very efficient cooling; immersion liquid cooling and conduction is over twenty times more efficient as a heat rejection medium than air. Suitable dielectric fluids are readily commercially available. Mineral oil is one such fluid that is not particularly harmful to the environment should a leak occur. Carbon dioxide turns to a liquid at pressures and temperatures that may exist at some deployment locations. A mixture of fluids that provide the desirable properties may be used.

When submerged, the immersion cooling fluid and consistent heat sink from the outside sea water temperature may be used to keep the electrical components that are running inside the container within a very low and narrow operating envelope. The rate of circulation may be controlled if needed, however because relatively deep water does not change in temperature very much, the design of the heat transfer subsystem can be such that circulation control is not needed, or at least not as much compared to air cooling or cooling at shallower depths where the external ambient temperature can significantly vary. This will improve the hardware reliability, and to an extent the hardware's operating efficiency.

Figure 3:
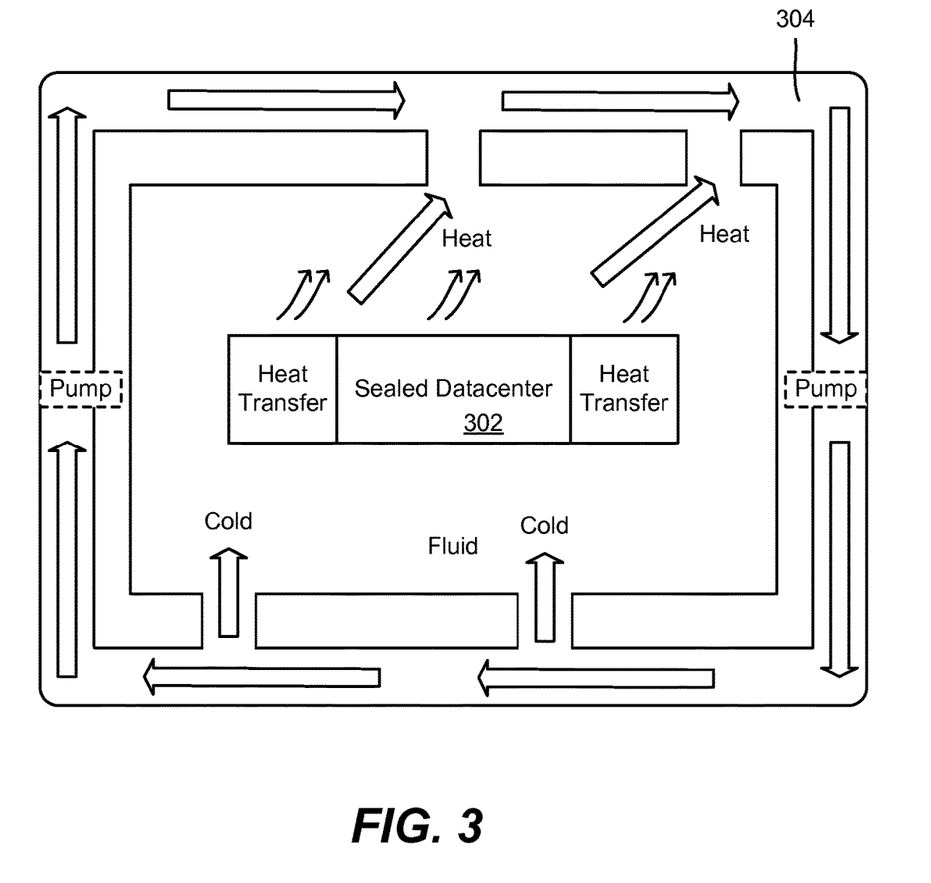
FIG. 3 is an example representation of how a cooling fluid may be used to transfer heat away from a datacenter or datacenter module, according to one or more example implementations.

For non-submerged deployments, or deployments in relatively shallow water, a sealed datacenter 302 (e.g., each module) may still be cooled by circulating fluid around it, even if the datacenter 302 itself is not filled with fluid, as generally represented in FIG. 3. If the datacenter or partial datacenter 302 is sealed within a sufficiently strong housing, the entire container 304 may be submerged into deeper and deeper water. Although this is likely far less efficient (e.g., in terms of container size, component density, rate of circulation and so on) relative to immersing a datacenter and its components in the fluid, a dielectric fluid is not needed in the example of FIG. 3, which may be a factor in certain situations.

Figure 4:
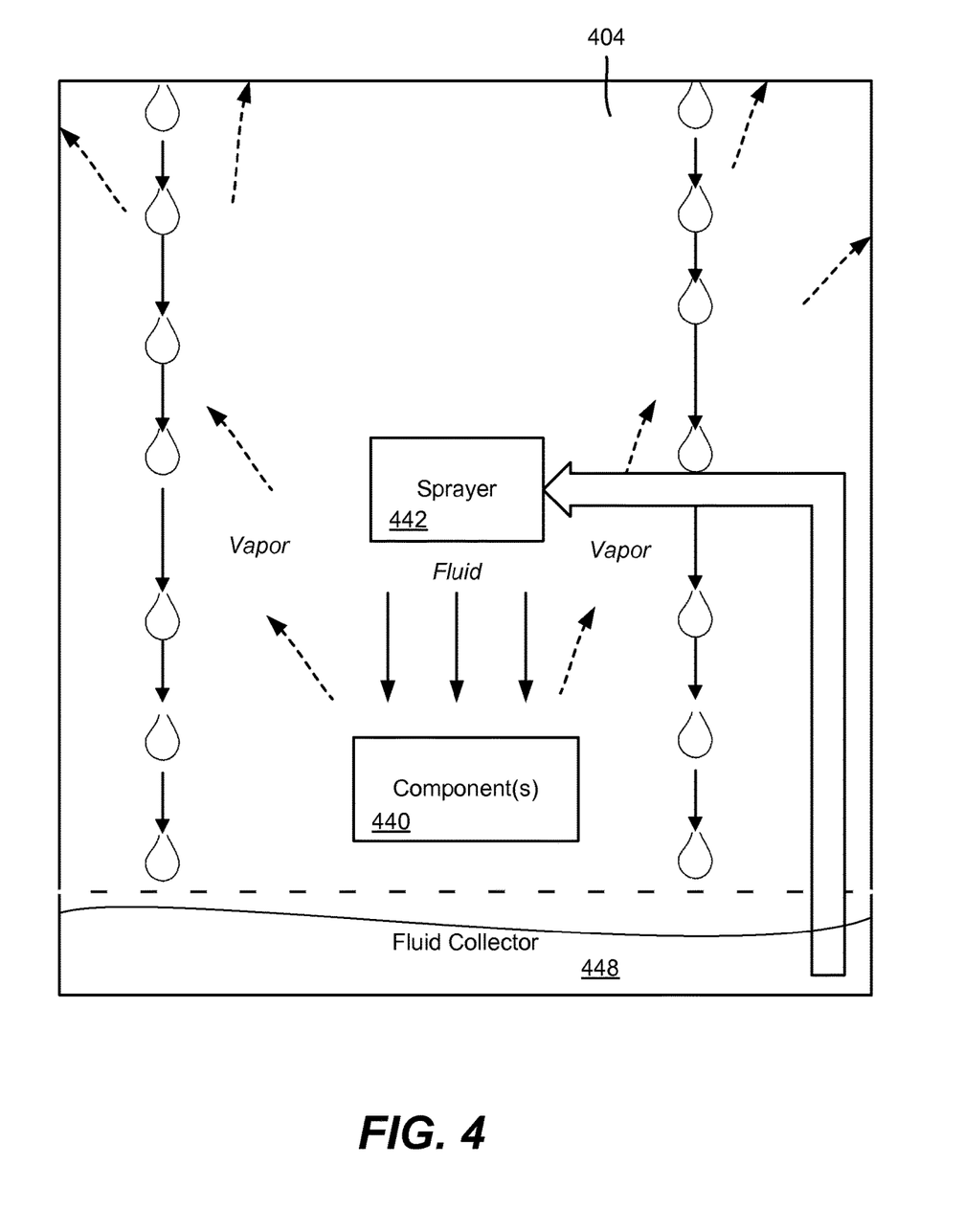
FIGS. 4 and 5 are block diagrams each representing an example of how a dielectric fluid may be used to cool datacenter components, according to one or more example implementations.
Figure 5:
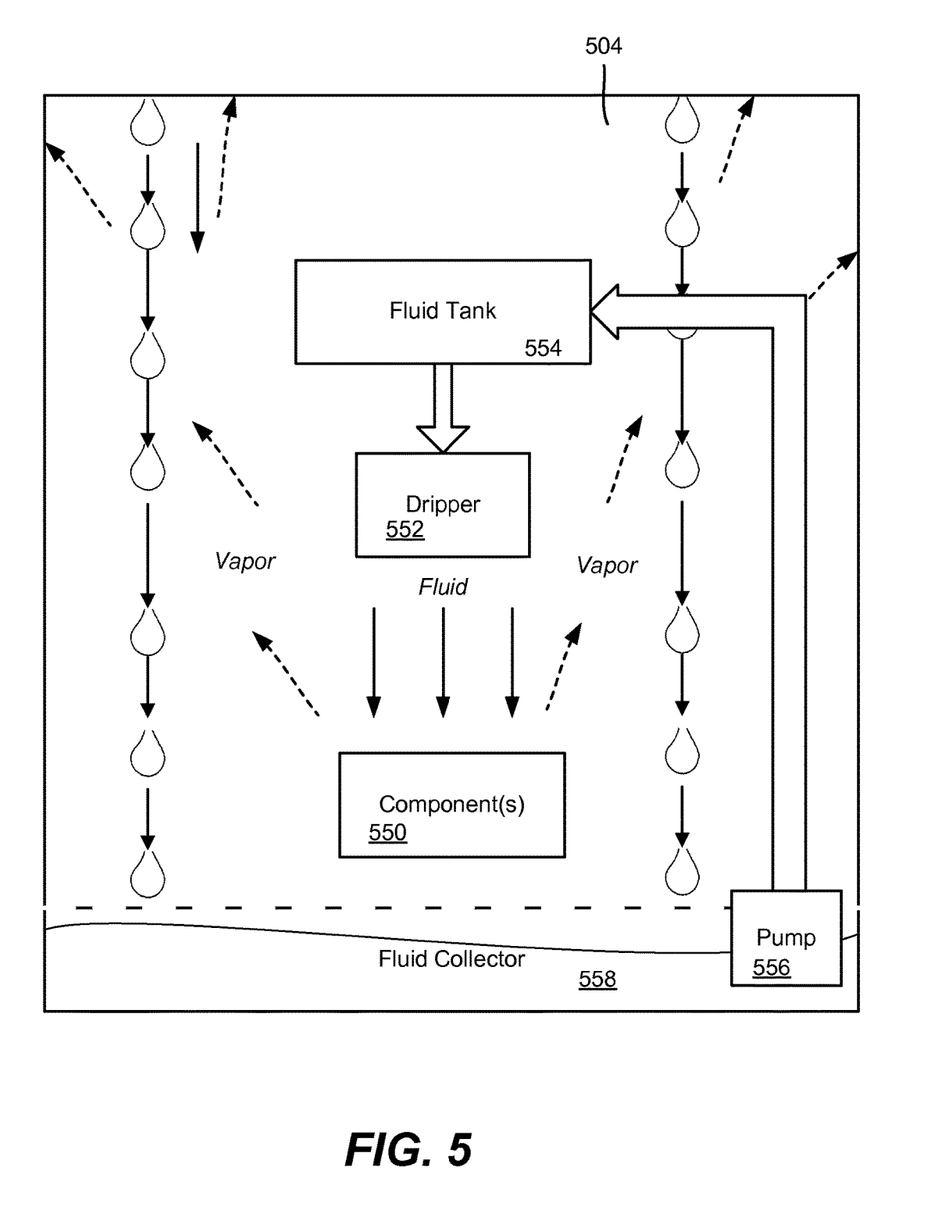

FIGS. 4 and 5 show examples in which fluid cooling may be used in a different way, namely as a dielectric fluid applied in its liquid state to a component 440 or 550, such as sprayed by a sprayer 442 (FIG. 4) or dripped by a dripper 552 (replenished from a tank 554) onto a microprocessor or heat sink coupled thereto, for example, or any group of components. When the fluid hits the component(s) 440 or 550, the heat of the component(s) vaporizes the liquid. The vapor cools back to a liquid, e.g., via the cooled walls of a container 404 or 504, which then drips into a collector 448 or 558. The sprayer 442 may pump from the collector 448 as in FIG. 4, or a pump 556 or the like may be used to pump the fluid back into the tank 554 as in FIG. 5. Any fluid that is not vaporized, e.g., one that hits a relatively cool component, simply drips into the collector 448 or 558. Note that an actual fluid collector need not be used, as the bottom of the container 404 or 504 can act as a collector.

Figure 6:
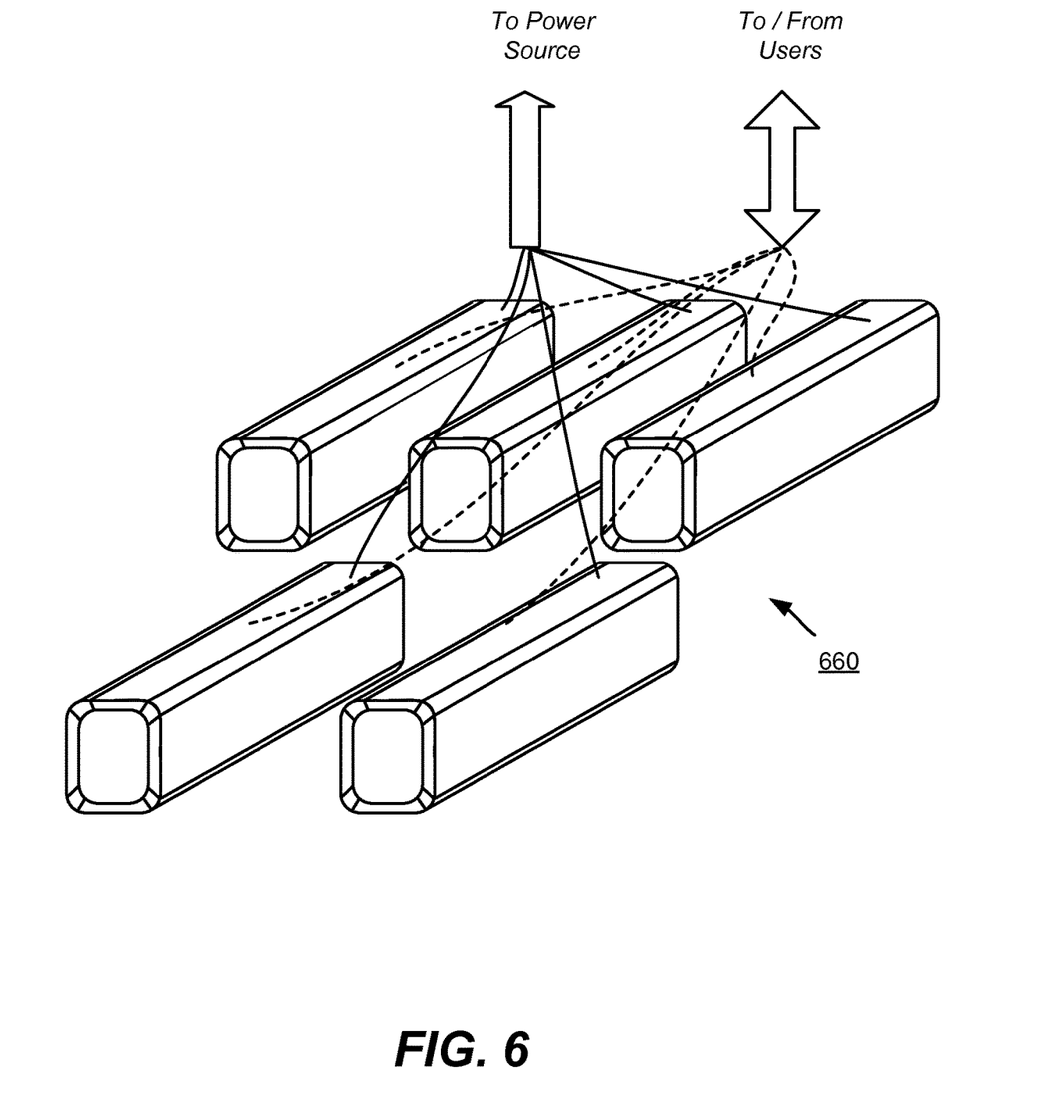
FIG. 6 is an example representation of a modular datacenter having chamfered edges to facilitate sealing of a cooling fluid therein, and strength, such as for submersion, according to one or more example implementations.

FIG. 6 shows a datacenter 660 comprised of a number of (e.g., five) datacenter modules that are arranged in an array, such as deployed on the ocean floor. In the example of FIG. 6, each module's housing serves as the fluid container, although it is feasible for the module housing to be put into a separate container. Each of the modules is connected to power and to a communication medium such as fiber optics for sending and receiving data communications. Note that any or all of the modules may be coupled to each other for communications within the datacenter.

The exemplified modules each include chamfered edges which in general, provides for better strength and sealing properties.

As described herein, the modules may be filled with dielectric fluid and deployed. The modules may be deployed underwater to a depth and/or location where they are reasonably secure (the containers would not be able to be opened underwater, at least not easily).

The water also provides a heat sink for conductive transfer of heat from the module's components to the internal fluid, and thereby to the surrounding water. For example, heat pipe technology or a hydronic loop may be used to draw heat from the hardware containing-tank through heat sink coils that are cooled by the outside water outside. In this way, the cooling system rejects heat from the servers to the surrounding body of water. The heat transfer in these mediums are very efficient with respect to keeping the change in temperature (delta T) small, which can minimize the impact to the surrounding ecosystem.

Further, datacenter components, which are sensitive to corrosive contamination, are protected by the dielectric fluid. Indeed, hardware in marine environments has a high failure rate from salt in the air and humidity.

Figure 7:
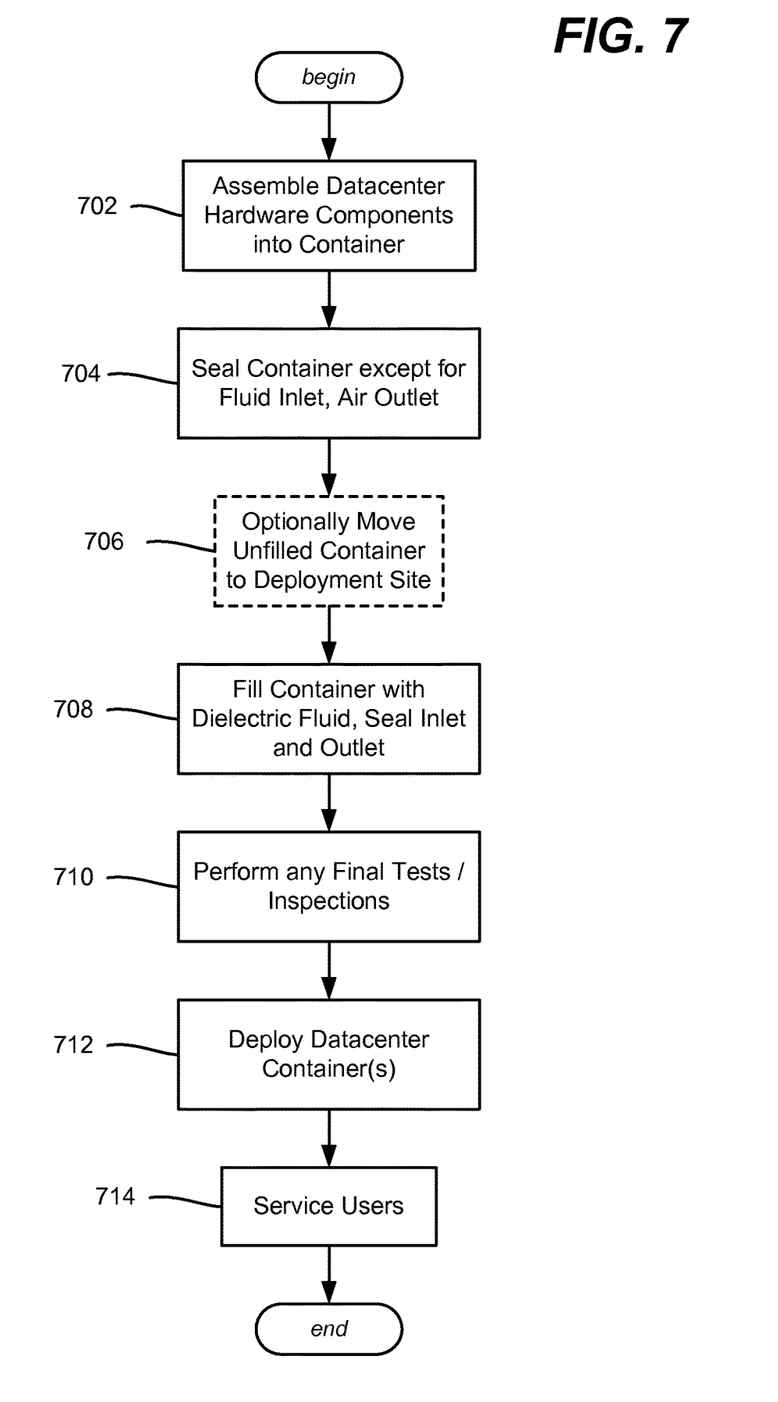
FIG. 7 is a flow diagram comprising example steps that may be used in immersing a datacenter in a cooling fluid, according to one or more example implementations.

With respect to construction and deployment, FIG. 7 is a flow diagram showing example steps; (note that at least some of the example steps need not occur in the order shown). In the example of FIG. 7, containers which may be separate modules are used as examples, however it is understood that an entire datacenter may be contained in container or module, and thus a single "module" may serve as a datacenter. Indeed, where population/demand for cloud services is not too great, a single module (as thought of in the conventional sense) may suffice to serve a region.

Step 702 represents installing the datacenter hardware components. Because of the immersive cooling, in general, these components may be much more densely arranged, both within each server/storage unit and with respect to one another. This allows the datacenter to be compact and efficient, which is cost effective (from both a water-tight enclosure perspective and volume of dielectric fluid perspective), as the larger the enclosure and the more fluid needed, the higher the cost.

Step 704 seals the container, except for the dielectric fluid inlet (and any gas outlet, if needed, such as to allow air to escape while filling). The container may then be transported (step 706) to its deployment site before it is filled, e.g., so it is lighter, meaning it can be floated (at least more easily) for towing/water deployments, and so forth.

Step 708 represents filling the container with the fluid (which may be a gas at surface pressures and temperatures), and sealing the inlet/outlet ports. If a large amount of fluid is needed, the fluid may be transported via a tanker, for example. At this time, the container and its components are ready for deployment, (after performing any final tests or inspections (step 710) that may be desirable to perform before deployment, particularly if sinking the datacenter in water). Note that it is feasible to move containers after filling, for example if surface conditions at the desired location makes it difficult to fill the container there.

Step 712 represents deployment, which includes attaching any external cabling to the modules, and if in water, sinking the containers. Step 714 represents using the datacenter to service users. Note that adding the dielectric fluid increases the weight of each container, and thus previously floating containers may now be able to sink into water by design. Multiple containers may be arranged on a platform, with the platform then sunk, assisted by the increased weight of the containers.

Fluid-filled datacenters are intended to be unmanned, at least largely. This is particularly significant for submerged datacenters, which may be located many (e.g., twenty-four) miles offshore and on the ocean floor, and thus may be extremely difficult to service. Thus, the design is that the datacenter is "unserviceable," with equipment and hardware expected to not fail during active usage. However, the use of modules allows for rotating new modules into a datacenter as older ones are removed, e.g., detached and floated up for recycling.

Example Datacenter Environment

One of ordinary skill in the art can appreciate that the various embodiments and methods described herein can be implemented in connection with any number of hardware devices, which can be deployed as part of a datacenter or other computing environment, and can be connected to any kind of data store or stores. Thus, the technology is not limited to a datacenter in the conventional sense, but may be used in any situation where computing power is needed near a certain location and heat dissipation is a consideration.

Figure 8:
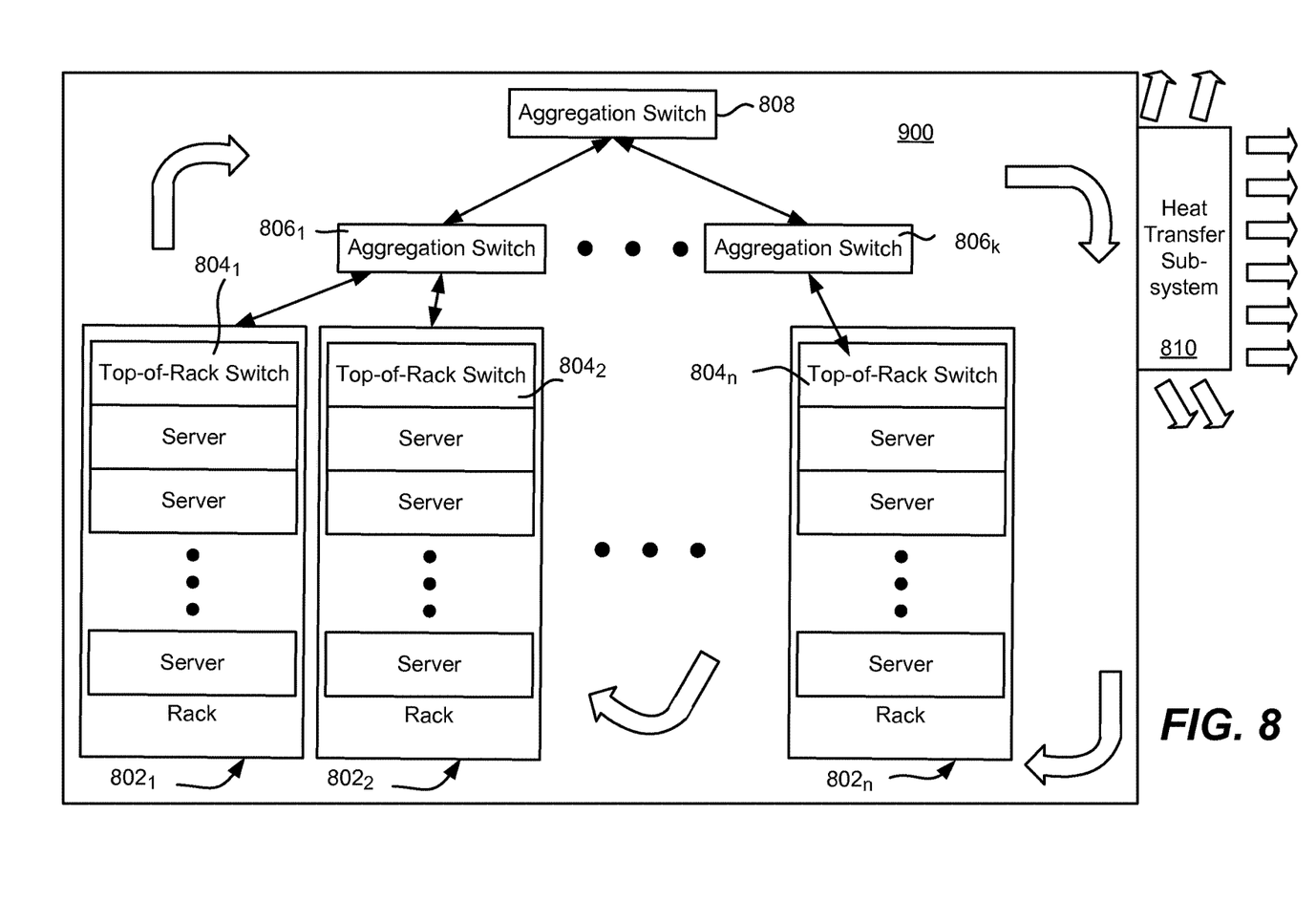
FIG. 8 is a block diagram representing an example datacenter cooled by circulating gas/fluid containing/computing device into which one or more aspects of various embodiments described herein can be implemented.

FIG. 8 shows an example submerged datacenter 800 (or one datacenter module) that is exemplified as having a tree-like topology. A plurality of racks $802_1$-$802_n$ each have servers, which communicate through a top of rack switch $804_1$-$804_n$. The servers may include storage, or at least part of the storage may be separately located. A typical network has twenty to forty servers per rack, with increasingly powerful links and switches going up the tree. Note that datacenters are not limited to tree-like topologies, but can be used in any topology. A small amount of the computing power may be used to monitor the submerged datacenter sensors, run any fans, pumps and so on, operate an active leveling system, and so on, although this may be done with separate machine logic.

As represented in FIG. 8, each top of rack switch $804_1$-$804_n$ is coupled to one another through one or more aggregation switches $806_1$-$806_k$. In this way, each server may communicate with any other server, including a server in a different rack. Note that in this example, a higher-level aggregation switch 808 couples the rack-level aggregation switches $806_1$-$806_k$, and there may be one or more additional levels of aggregation switch couplings.

As represented in FIG. 8 by the rounded arrows, the exemplified datacenter has gas and/or dielectric fluid circulated throughout, which may be via pumps, fans and/or natural circulation. A heat transfer subsystem 810, which may use coils, radiators, fluid pumps, fans and so forth transfers heat away from the datacenter/module to the surrounding water and/or for use in power generation. Note that a module's or datacenter's hull itself may be used as a heat transfer mechanism.

CONCLUSION

While the invention is susceptible to various modifications and alternative constructions, certain illustrated embodiments thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

In addition to the various embodiments described herein, it is to be understood that other similar embodiments can be used or modifications and additions can be made to the described embodiment(s) for performing the same or equivalent function of the corresponding embodiment(s) without deviating therefrom. Still further, multiple processing chips or multiple devices can share the performance of one or more functions described herein, and similarly, storage can be effected across a plurality of devices. Accordingly, the invention is not to be limited to any single embodiment, but rather is to be construed in breadth, spirit and scope in accordance with the appended claims.

What is claimed is:

1. A system comprising:
   a datacenter or partial datacenter immersed in a cooling fluid, the data center or partial datacenter comprising:
   a sealed container that surrounds and seals the cooling fluid and the datacenter or partial datacenter, the sealed container configured for submersion in submarine conditions, including having chamfered edges; and
   a heat transfer subsystem configured to cool the cooling fluid and the datacenter or partial datacenter and transfer heat away from the datacenter or partial datacenter to surrounding water in the submarine conditions, including to circulate a dielectric fluid throughout the sealed container via a sealed circulation pipe passing through the sealed container and to transfer heat from the circulated dielectric fluid to the surrounding water via a heat transfer mechanism.

2. The system of claim 1 wherein the cooling fluid is a dielectric fluid, and wherein components of the datacenter are immersed in the dielectric fluid.

3. The system of claim 1 wherein the container incorporates or is coupled to at least one pump to circulate the cooling fluid.

4. The system of claim 1 wherein the sealed container is submerged in water, and wherein the heat transfer subsystem is configured to cool the cooling fluid and the datacenter or partial datacenter by transferring at least some heat from the sealed container to the water.

5. The system of claim 4 wherein the container is sufficiently filled with the cooling fluid to reduce or equalize a pressure difference between external water pressure and at least part of the internal container pressure.

6. The system of claim 4 wherein the heat transfer subsystem comprises heat pipe technology that provides conductive transfer of heat from the cooling fluid within the sealed container to the water surrounding the sealed container.

7. A system comprising:
a datacenter or partial datacenter enclosed in a sealed container comprising chamfered edges and submerged in water in submarine conditions, the sealed container further comprising:
a heat transfer subsystem that transfers heat away from the sealed container into the water, including by circulating a cooling fluid throughout the sealed container to reduce or equalize a pressure difference between external water pressure external to the sealed container and at least part of an internal pressure of the sealed container and to transfer the heat away from the sealed container into the water.

8. The system of claim 7 wherein the heat transfer subsystem comprises a pump that circulates the cooling fluid within the sealed container.

9. The system of 7 wherein at least part of the heat transfer subsystem uses a surface of the sealed container to transfer at least some heat to the water in submarine conditions outside the sealed container.

10. The system of 7 wherein the heat transfer subsystem comprises a hydronic loop that provides conductive transfer of heat from the cooling fluid within the sealed container to the water surrounding the sealed container.

11. The system of 7 wherein at least part of the heat transfer subsystem uses at least one heat pipe to cool the datacenter or partial datacenter and the cooling fluid.

* * * * *